(12) United States Patent
Caporaso

(10) Patent No.: US 8,563,957 B2
(45) Date of Patent: Oct. 22, 2013

(54) PHOTOCONDUCTIVE SWITCH PACKAGE

(75) Inventor: George J. Caporaso, Livermore, CA (US)

(73) Assignee: Lawrence Livermore National Security, LLC., Livermore, CA (US)

( * ) Notice: Subject to any disclaimer, the term of this patent is extended or adjusted under 35 U.S.C. 154(b) by 625 days.

(21) Appl. No.: 12/775,156

(22) Filed: May 6, 2010

(65) Prior Publication Data

US 2010/0282949 A1 Nov. 11, 2010

Related U.S. Application Data

(60) Provisional application No. 61/176,375, filed on May 7, 2009.

(51) Int. Cl.
*H03K 17/78* (2006.01)
*H01L 23/48* (2006.01)

(52) U.S. Cl.
USPC ............... 250/551; 250/214 SW; 257/431; 257/773

(58) Field of Classification Search
USPC ............... 250/551, 214.1, 214 SW, 214 R; 257/431, 432, 433, 452, 457, 773, 786
See application file for complete search history.

(56) References Cited

U.S. PATENT DOCUMENTS

| | | | | |
|---|---|---|---|---|
| 5,028,971 A | * | 7/1991 | Kim et al. | 257/459 |
| 5,319,218 A | * | 6/1994 | Kim et al. | 257/1 |
| 6,263,124 B1 | * | 7/2001 | Min et al. | 385/16 |
| 7,009,209 B2 | * | 3/2006 | Casady et al. | 257/77 |
| 7,615,787 B2 | * | 11/2009 | Ouchi | 257/76 |
| 7,893,541 B2 | * | 2/2011 | Caporaso et al. | 257/778 |
| 8,125,089 B2 | * | 2/2012 | Caporaso et al. | 257/778 |
| 8,258,632 B1 | * | 9/2012 | Sullivan et al. | 257/778 |
| 2005/0215031 A1 | * | 9/2005 | Ouchi | 438/459 |
| 2005/0285541 A1 | * | 12/2005 | LeChevalier | 315/169.3 |
| 2007/0092812 A1 | * | 4/2007 | Caporaso et al. | 430/57.7 |
| 2007/0292074 A1 | * | 12/2007 | Mazzola | 385/14 |
| 2008/0093625 A1 | * | 4/2008 | Sacks et al. | 257/184 |
| 2008/0314152 A1 | * | 12/2008 | Ouchi | 73/597 |
| 2009/0261258 A1 | * | 10/2009 | Harris et al. | 250/370.01 |
| 2010/0006780 A1 | * | 1/2010 | Metcalfe et al. | 250/504 R |
| 2010/0282949 A1 | * | 11/2010 | Caporaso | 250/214 SW |
| 2011/0101376 A1 | * | 5/2011 | Caporaso et al. | 257/77 |
| 2011/0101891 A1 | * | 5/2011 | Caporaso et al. | 315/501 |
| 2011/0133203 A1 | * | 6/2011 | Werne et al. | 257/76 |
| 2011/0198515 A1 | * | 8/2011 | Wraback et al. | 250/504 R |
| 2012/0082411 A1 | * | 4/2012 | Sullivan et al. | 385/14 |

FOREIGN PATENT DOCUMENTS

WO 01/47023 A1 6/2001

* cited by examiner

*Primary Examiner* — John Lee
(74) *Attorney, Agent, or Firm* — John P. Wooldridge

(57) ABSTRACT

A photoconductive switch is formed of a substrate that has a central portion of SiC or other photoconductive material and an outer portion of cvd-diamond or other suitable material surrounding the central portion. Conducting electrodes are formed on opposed sides of the substrate, with the electrodes extending beyond the central portion and the edges of the electrodes lying over the outer portion. Thus any high electric fields produced at the edges of the electrodes lie outside of and do not affect the central portion, which is the active switching element. Light is transmitted through the outer portion to the central portion to actuate the switch.

18 Claims, 4 Drawing Sheets

PHOTOCONDUCTIVE SWITCH PACKAGE

RELATED APPLICATIONS

This application claims priority from Provisional Application Ser. No. 61/176,375, filed May 7, 2009, titled "Photoconductive Switch Package" which is herein incorporated by reference.

GOVERNMENT RIGHTS

The United States Government has rights in this invention pursuant to Contract No. DE-AC52-07NA27344 between the United States Department of Energy and Lawrence Livermore National Security, LLC.

BACKGROUND OF THE INVENTION

1. Field of the Invention

The present invention relates generally to photoconductive switches and more particularly to optically initiated silicon carbide (SiC) and other high voltage switches.

2. Description of Related Art

Particle accelerators, for example dielectric wall accelerators (DWAs), critically depend on high voltage, high current, fast closing switches that can be activated with nanosecond precision. Photoconductive switches offer the most potential in terms of handling such high voltages and high currents with minimum inductance, rapid closure, precise temporal control and the possibility of long life. Photoconductive switching is a technique in which optical energy is applied to a semiconductor material, and the optical energy creates carriers within the semiconductor, rendering it conductive.

The materials that have been used to date for photoconductive switch applications include Silicon and Gallium Arsenide (GaAs). The difficulty with these materials is that various failure mechanisms occur, even at modest parameters. Further, the optical absorption depth for these materials is low, so the carriers are forced to flow in a very thin area of the material bulk just below the surface. The principal issue with photoconductive switching has been short lifetime resulting from overstressing current and voltage conditions.

Additionally, silicon carbide (SiC) has long been a promising alternative candidate for use as a photoconductive switch material. Only very recently, however, has this particular material been commercially available in sizes and purity that merit application as a high voltage switch. SiC material has high dielectric breakdown strength, greater than that of most solid materials (about 4 MV/cm); high thermal conductivity (comparable to that of copper); and low optical absorption. Thus, with the availability of single crystalline Silicon Carbide, a new class of switches is possible.

While promising, even SiC is subject to failure due to high electric fields locally produced where the electrodes separate from contact with the photoconductive substrate. A prior art photoconductive switch, having a SiC photoconductive substrate and two opposing electrodes, typically has a meniscus formed at the metal contact between the electrode and substrate surfaces. The meniscus refers to a small blob of indium solder that is used to bond an electrode to the substrate surface. The magnitude of the electric field on the contact surfaces has a spike in magnitude at the triple points. The triple point is a region where the electrode edge, the SiC wafer, and another material like an insulating oil all come together. The indium solder has some vertical height to it that permits oil to come in contact with both the electrode and wafer, causing the triple point. Various methods have been employed to reduce and minimize these fields at such "triple points," including filling the space between the electrode and substrate with a high permittivity material. However, there is still an electric field spike, albeit with less magnitude, at the triple point of electrode-substrate separation.

Copending U.S. patent application Ser. No. 11/586,468 describes a photoconductive switch with a photoconductive substrate having opposing electrode-contacting surfaces and a facet optically connectable to an optical source for receiving optical energy; two electrodes electrically connected to the electrode-contacting surfaces of the substrate, for applying a potential across the substrate; and two field-grading liners formed on the substrate surrounding the electrode-contacting surfaces, for grading the electric fields therealong. The field-grading liners may be adjacent to the electrode perimeters, or they may be adjacent to the substrate perimeter, but they are integrally formed into the substrate. The field-grading liners may be made of high permittivity materials or conductive or semi-conductive materials; a suitable material is silicon nitride. The liners may be formed as doped sub-surface layers of the substrate, extending into the substrate about 1 micron deep. Optionally, the substrate can be a multilayer having at least two photoconductive layers separated by a divider layer, with the divider layer composed of conductive and semi-conductive materials. While the field-grading liners may reduce the electric field effects, they add a level of complexity since they must be fabricated into the photoconductive substrate. Another problem with resistive liners is that they usually must be custom configured for a particular pulse width of applied voltage and will not work for arbitrary waveforms.

The photoconductive substrate shown in Ser. No. 11/586,468 may have two opposing concavities and the two electrodes may have convex surfaces contactedly seated in the two concavities. These electrode shapes could be used in the present invention.

What is needed therefore is a photoconductive switch for high voltage applications such as for particle accelerators, preferably implemented with SiC or other photoconductive materials such as GaN, that minimizes or at least reduces the high magnitude electric fields at the points of electrode-substrate separation. A switch design that does not require alteration of the photoconductive substrate would be highly advantageous.

BRIEF SUMMARY OF THE INVENTION

The invention is a photoconductive switch and method of making same. The switch is formed of a substrate that has a central portion of SiC or other photoconductive material and an outer portion of cvd-diamond or other suitable material surrounding the central portion. Conducting electrodes are formed on opposed sides of the substrate. The dimensions of the electrodes are greater than the dimensions of the central portion of the substrate so that the electrodes extend beyond the central portion and the edges of the electrodes lie over the outer portion. Thus any high electric fields produced at the edges of the electrodes lie outside of and are substantially isolated from the central portion, which is the active switching element. Light is transmitted through the outer portion to the central portion to actuate the switch.

The invention includes a photoconductive switch, having a substrate made up of a photoconductive central portion and a non-photoconductive outer portion surrounding the central portion; and conducting electrodes formed on opposed sides of the substrate, with the electrodes extending beyond the central portion and the edges of the electrodes lying over the outer portion.

The invention also includes a photoconductive switch, having a substrate made up of a photoconductive central portion and an outer portion surrounding the central portion; the substrate having opposed electrode-contacting surfaces and a light receiving facet orthogonal to the electrode-contacting surfaces; conducting electrodes electrically connected to the opposed electrode-contacting surfaces of the substrate for applying a potential across the substrate; the dimensions of the electrodes being greater than the dimensions of the central portion so that the electrodes extend beyond the central portion and the edges of the electrodes lie over the outer portion; wherein the effects of high electric fields produced at the edges of the electrodes lie outside of and do not substantially affect the central portion.

The invention further includes a method of making a photoconductive switch, by providing a photoconductive central portion; bonding an outer portion thereto to form a switch substrate; and forming electrodes on the switch substrate, the electrodes extending beyond the central portion so that the electrode edges lie over the outer portion.

Further aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 3A:
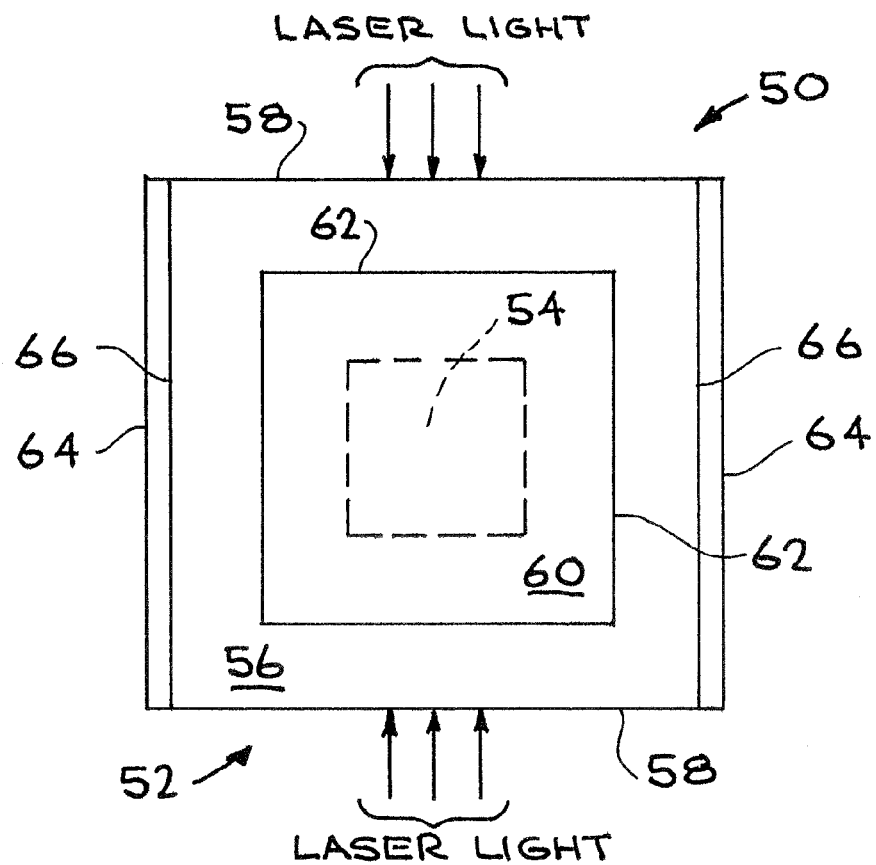
FIGS. 3A, B are a top plan view and a cross-sectional side view of a photoconductive switch of the invention.

Referring more specifically to the drawings, for illustrative purposes the present invention is embodied in the apparatus and method generally shown in FIGS. 3A, B and 4. It will be appreciated that the apparatus may vary as to configuration and as to details of the parts, and the method may vary as to its particular implementation and as to specific steps and sequence, without departing from the basic concepts as disclosed herein.

The photoconductive switch of the present invention is based on the basic prior art photoconductive switch construction and operation, with enhancements enabling the switch to handle high voltages and high currents with minimum inductance, rapid closure, precise temporal control and the possibility of long life. As such, the photoconductive switch of the present invention shares much the same construction and features as a basic photoconductive switch, generally having a substrate of photoconductive material between two electrodes. Without optical energy injection, i.e. in the dark, the photo-conductive material is an insulator with a large resistance value (much larger than the circuit impedance) and thus the switch essentially blocks current flow. When optical energy is injected and absorbed in the photoconductive material, the switch resistance drops to a small value (much less than the circuit impedance) and the switch conducts current. Thus the basic photoconductive switch is essentially an optically controlled resistance. The availability of relatively small pulsed lasers or other optical sources enable the injection of optical energy in a short pulse so that the switching time between large blocking resistance and small conduction resistance can easily be several nanoseconds.

Figure 1A:
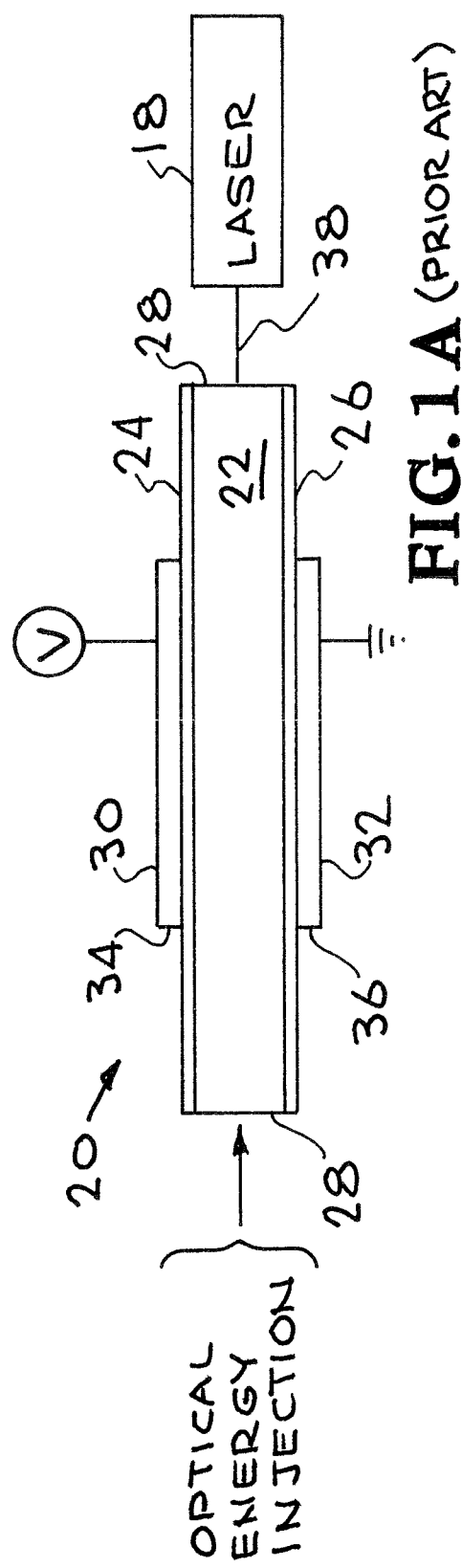
FIG. 1A is a cross-sectional side view of a prior art basic photoconductive switch.

FIG. 1A shows the basic features of a prior art photoconductive switch 20 formed of a photoconductive substrate 22 with a pair of opposed electrode-contacting surfaces 24, 26 and a facet 28 orthogonal to the surfaces 24, 26. Facet 28 is optically connectable to an optical source for receiving optical energy therefrom to actuate the switch. For example, a laser or other light source 18 may be coupled to a light receiving facet 28 by optical fibers 38. Substrate 22 is typically a thin wafer made of SiC or other suitable material. Electrodes 30, 32 are electrically connected, respectively, to the electrode-contacting surfaces 24, 26 of the substrate 22, for applying a potential across the substrate, as represented by the voltage "V" and ground. When a voltage is applied across electrodes 30, 32, and the switch 20 is "open" or "off," high electric fields are produced at the edges 34, 36 of electrodes 30, 32. Since electrodes 30, 32 are smaller in area than substrate 22, edges 34, 36 are on the substrate 22 and the high electric fields may affect the substrate 22, and, e.g., cause breakdown or premature closing of the switch.

Figure 1B:
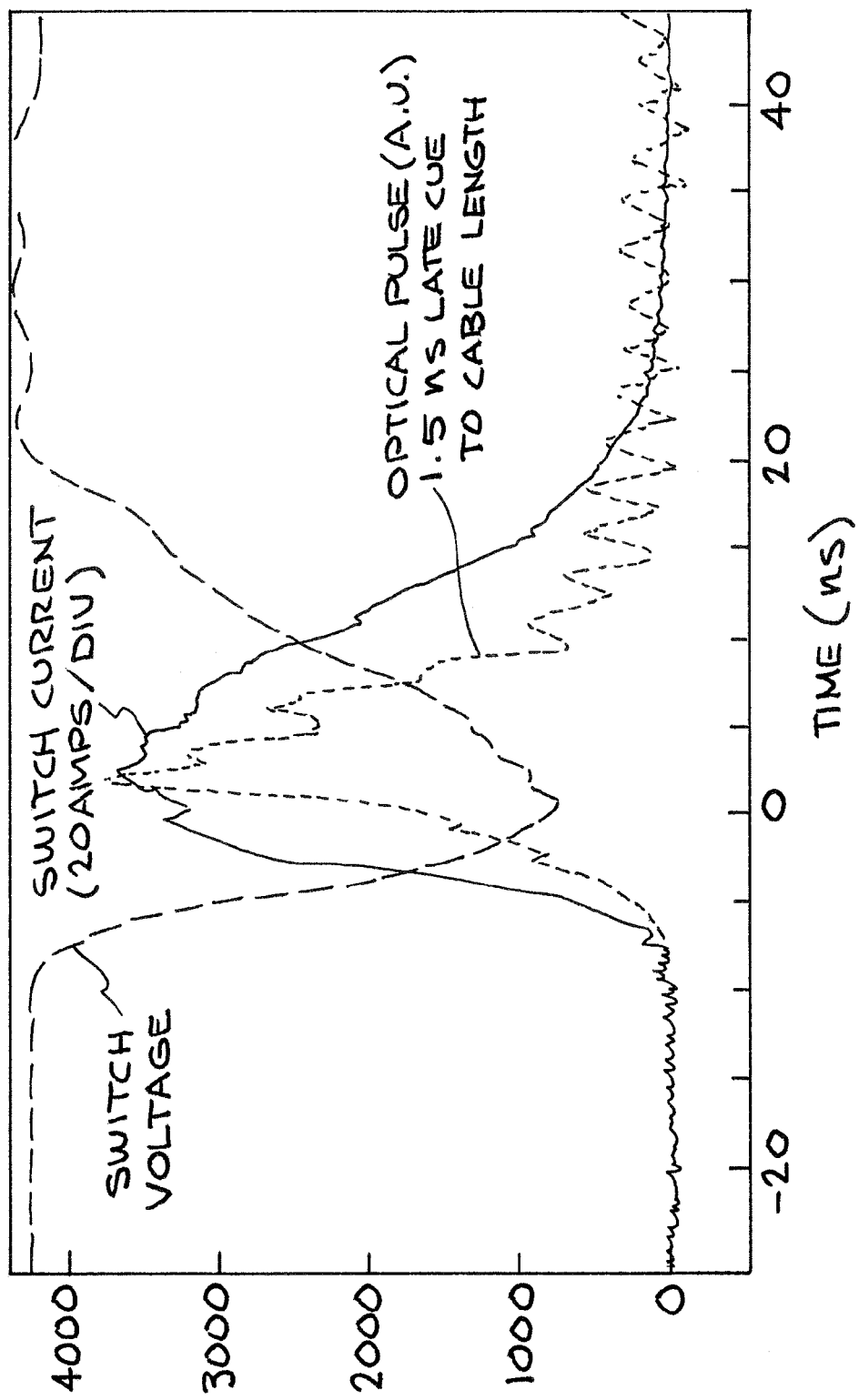
FIG. 1B is a graph of the operation of a photoconductive switch.

FIG. 1B illustrates the basic operation of switch 20. When no light is injected into facet 28, substrate 22 is nonconductive so no current flows and the voltage is held across the switch. When an optical pulse from source 18 is injected into substrate 22 through facet 28, switch 20 is "closed" or "on," substrate 22 becomes conducting, switch current flows, and the voltage across the switch drops. When the light pulse ends, switch 20 turns off again. Thus the light source 18 is used to control switch operation. However, the electric fields produced at edges 34, 36 of electrodes 30, 32 may cause the switch 20 to close at unwanted times because they may lead to breakdown through substrate 22.

Figure 2A:
FIGS. 2A, B are cross-sectional views of an upper half of first and second exemplary embodiments of a prior art photoconductive switch with filed-grading liners.
Figure 2B:
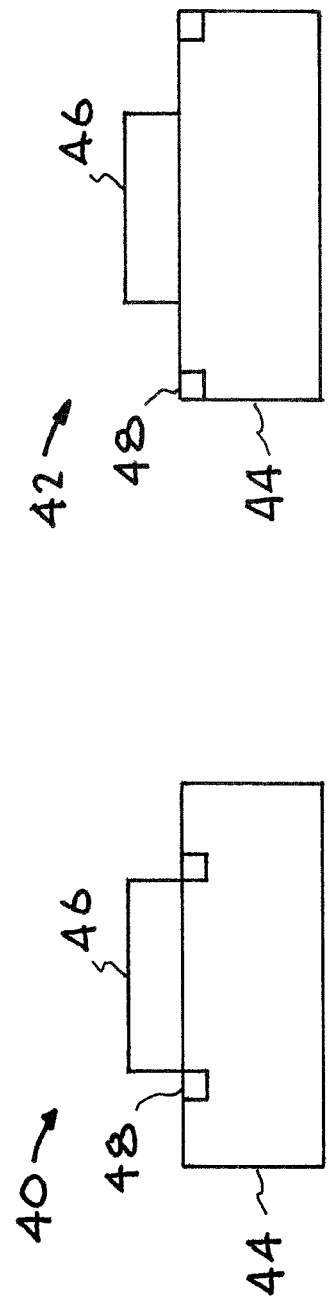

FIGS. 2A, B illustrate a pair of prior art switches 40, 42 formed of a substrate 44 with an electrode 46 on a surface thereof. Field-grading liners 48 are also formed in the substrate, either at the electrode edge or the substrate edge, to mitigate the electric field effects.

Figure 3B:
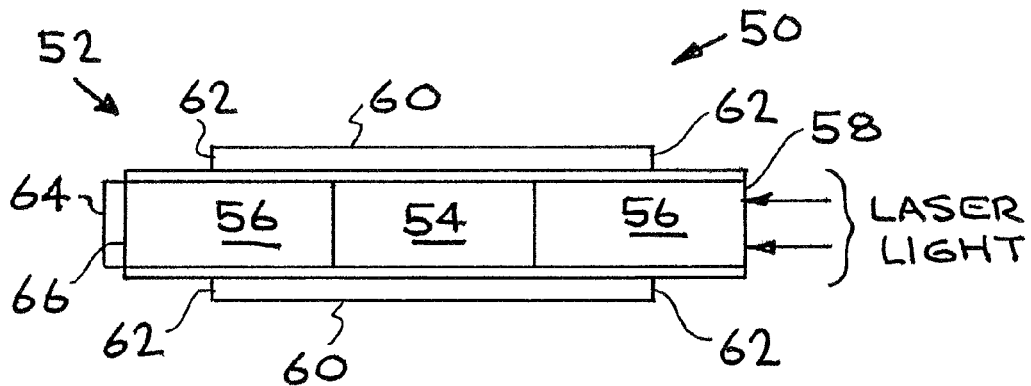

FIGS. 3A, B show a photoconductive switch 50 of the invention. Switch 50 is formed of a substrate 52 that has a central portion 54 of SiC or other photoconductive material and an outer portion 56 of cvd-diamond or other suitable material surrounding the central portion 54. Conducting electrodes 60 are formed on opposed sides (electrode-contacting surfaces) of substrate 52. The dimensions of electrodes 60 are greater than the dimensions of central portion 54 of substrate 52 so that electrodes 60 extend beyond central portion 54 and the edges 62 of electrodes 60 lie over outer portion 56. Thus any high electric fields produced at the edges 62 of electrodes 60 lie outside of and do not affect the central portion 54, which is the active switching element of switch 50. In operation, laser or other light is input to switch 50 through one of more light receiving facets 58. For example, light from a source 18 may be coupled through optical fibers 38 as in FIG. 1A. The light passes through outer portion 56 to photoconductive central portion 54 where it actuates the switch as described previously. One or more non-light receiving facets 66 may be coated with a thin dielectric layer 64 to improve optical properties, e.g. produce total internal reflection, i.e. to keep the light inside the switch bottled up so that it will keep interacting with the switch rather than escaping from the switch. In FIG. 3A light is introduced into two opposed light receiving facets 58 so there are two non-light receiving facets 66 while in FIG. 3B light is introduced into one light receiving facet 58 so there are three non-light receiving facets 66 (only one of which is shown).

The material for outer portion 56 of substrate 52 should be a material with a higher bulk breakdown strength than the material in the central portion. It should also be optically transparent to the light used to actuate the switch. In addition it should be thermally conductive to remove heat from the central portion of the switch and it should form a strong electric field tolerant bond to the central portion. Optimally, the material is not photoconductive so it is not the active part of the switch; it allows the photoconductive active part of the switch to function while handling the electric field stresses at the electrode edges and guides light to the active part.

Cvd-diamond is an excellent material for the outer portion of the substrate. The bulk breakdown strength of good quality diamond is about 10 MV/cm, compared to 4 MV/cm for SiC, so it can handle the enhanced field stresses at the electrode edges. Diamond has very large thermal conductivity so it can remove heat from the switches into a region of low electric field for ultimate removal. Cvd-diamond can be made optically transparent so it can act as a light guide for switch illumination to reach the central portion of the switch. Cvd-diamond can form a strong, electric field tolerant bond to SiC since both materials contain carbon; this joint will resist electrical breakdown.

Figure 4:
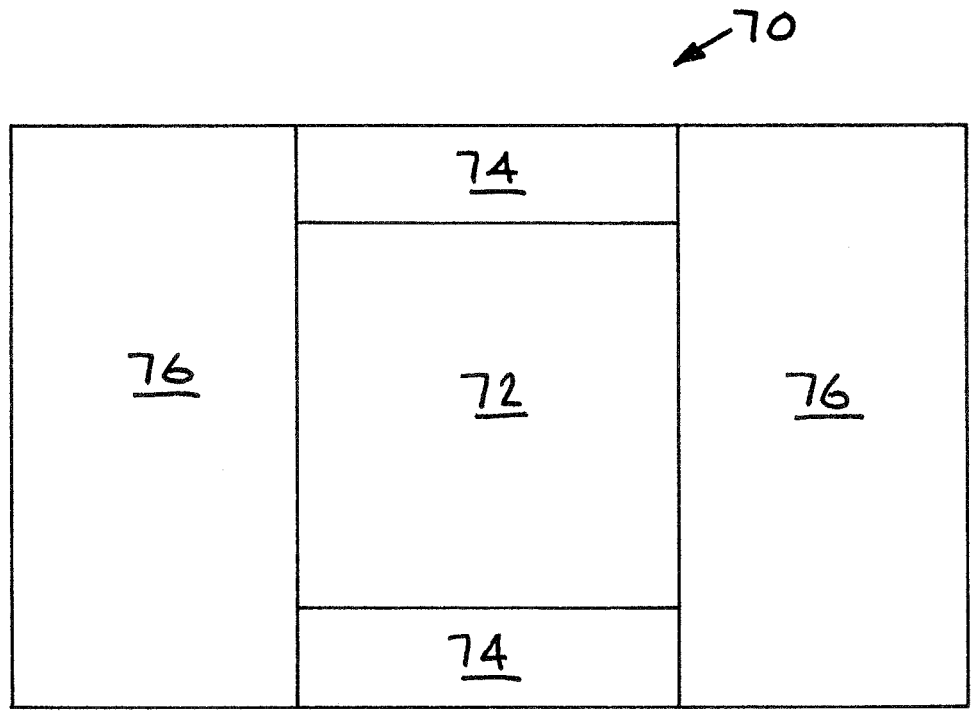
FIG. 4 is an assembly drawing of the photoconductive switch substrate of the invention.

FIG. 4 illustrates the assembly of a photoconductive switch substrate 70 of the invention; substrate 70 is similar to substrate 50. The central portion 72 of photoconductive material, typically square in shape, is prepared. A pair of outer portion elements 74, of the same width as central portion 72 are prepared and bonded to two opposed sides of central portion 72. Then a pair of outer portion elements 76, of a width equal to that of central portion 72 plus the two elements 74, are prepared and bonded to the remaining two opposed sides of central portion 72 and the sides of elements 74. When assembled together, elements 74, 76 form the outer portion similar to outer portion 56. The electrodes are then applied to the substrate 70. Alternately, all four sides could be grown simultaneously on the central portion so that individual pieces are not required.

The invention includes a method of making a photoconductive switch by providing a photoconductive central portion and bonding an outer portion thereto to form a switch substrate. Electrodes are then formed on the switch substrate, the electrodes extending beyond the central portion so that the electrode edges lie over the outer portion.

Preferably, the photoconductive switch of the present invention uses Compensated, Semi-Insulating Silicon Carbide (CSI-SiC) as the photoconductive substrate, since it is considered the best material for application in high power photoconductive switch applications. This is due to the following reasons. CSI-SiC's very large dielectric strength (3 MV/m) permits very thin layers to support large voltages (e.g. GaAs can only support about 250 kV/cm). CSI-SiC switches thus require reduced levels of optical closure energy since the required optical closure energy scales as the thickness of the CSI-SiC material. CSI-SiC's large dark resistance ($10^{11}$-$10^{15}$ Ohm-cm) permits low rates of voltage application or charging (maximum GaAs resistivity is about $10^9$ Ohm-cm). CSI-SiC's large thermal conductivity permits high average power operation without thermally induced conduction (GaAs thermal conductivity is only 10% of SiC). The compensated nature of CSI-SiC, i.e. the dopant concentration, enables the design of recombination times, optical absorption depths, and thus current densities. GaN is also a preferred material for the switch.

The substrate may be a compensated, semi-insulating material selected from SiC (e.g. 4 h SiC or 6 h SiC), GaN, AlN, and diamond, and preferably having a hexagonal crystal structure and cut in a plane selected from the A-Plane, C-Plane and M-plane. The semi-insulating SiC or other material is preferably doped with at least one of the following dopants: Boron, Vanadium, Nitrogen, Aluminum, Phosphorus, Oxygen, Tungsten and Zinc.

The photoconductive switches preferably use wide band gap material with below band gap illumination. The photoconductive substrate may be a greater-than-2.5 eV wide band gap material.

The invention thus provides a photoconductive switch to handle high voltages and high currents with minimum inductance, rapid closure, precise temporal control and the possibility of long life. The photoconductive switches have a configuration with the contacts or electrodes placed in relation to the photoconductive material so that the effects of high electric field stress at the electrode edges are reduced or eliminated. The switches have numerous applications, including high energy particle accelerators, including dielectric wall accelerators (DWAs). The switch could be used in a compact proton accelerator for medical therapy.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

I claim:

1. A photoconductive switch, comprising:
a substrate comprising:
a photoconductive central portion;
a non-photoconductive outer portion surrounding the central portion; and
conducting electrodes formed on opposed sides of the substrate, with the electrodes covering the central portion and extending beyond the central portion, wherein each electrode comprises an edge, wherein each of the edges of the electrodes lie over the outer portion.

2. The switch of claim 1, wherein the outer portion is formed of a first material with a higher bulk breakdown strength than a second material in the central portion.

3. The switch of claim 2, wherein the first material is optically transparent to light used to actuate the switch.

4. The switch of claim 3, wherein the outer portion is formed of a material that is sufficiently thermally conductive to effectively remove heat from the central portion of the switch.

5. The switch of claim 4, wherein the outer portion is formed of a material that forms a strong electric field tolerant bond to the central portion.

6. The switch of claim 1, wherein the central portion is formed of a wide band gap material.

7. The switch of claim 6, wherein the wide band gap material is a greater-than-2.5 eV wide band gap material.

8. The switch of claim 1, wherein the central portion is formed of a compensated, semi-insulating material.

9. The switch of claim 8, wherein the material is selected from SiC, GaN, AlN, and diamond.

10. The switch of claim 9, wherein the material is SiC doped with at least one of the following dopants: Boron, Vanadium, Nitrogen, Aluminum, Phosphorus, Oxygen, Tungsten and Zinc.

11. The switch of Claire wherein the outer portion is formed of cvd-diamond.

12. The switch of claim 11, wherein the central portion is formed of SiC.

13. The switch of claim 1, further comprising a voltage source electrically connected to the electrodes.

14. The switch of claim 1, further comprising a light receiving facet orthogonal to the opposed sides on which the electrodes are formed for receiving optical energy to actuate the switch.

15. The switch of claim 14, further comprising a laser or other light source optically coupled to the light receiving facet.

16. A photoconductive switch, comprising:
a substrate comprising:
  a photoconductive central portion comprising a first material; and
  an outer portion surrounding the central portion, wherein the substrate has a first electrode-contacting surface on a first side of the substrate and a second electrode-contacting surface on a second side of the substrate directly opposite of the first side wherein the substrate further includes a light receiving facet orthogonal to the first electrode-contacting surface and the second electrode-contacting surface; and
conducting electrode electrically connected to the first electrode-contacting surface and a second conducting electrode electrically connected to the second electrode-contacting surface, wherein the first conducting electrode and the second conducting electrode are configured for applying a potential across the substrate, wherein the dimensions of the electrodes are greater than the dimensions of the central portion so that the electrodes cover the central portion and extend beyond the central portion and all of the edges of the electrodes lie over the outer portion, wherein the effects of high electric fields produced at the edges of the electrodes lie outside of and do not substantially affect the central portion, wherein the outer portion is formed of a second material that has a higher bulk breakdown strength than the first material in the central portion and that is optically transparent to light used to actuate the switch, and the central portion is formed of a wide band gap material.

17. The switch of claim 16, wherein the outer portion is made of cvd-diamond and the central portion is made of SiC or GaN.

18. The switch of claim 16, further comprising a voltage source electrically connected to the electrodes and a laser or other light source optically coupled to the facet.

* * * * *